(12) United States Patent
Raff

(10) Patent No.: US 9,047,044 B2
(45) Date of Patent: Jun. 2, 2015

(54) TRIMLESS GLASS ENCLOSURE INTERFACE

(71) Applicant: Apple Inc., Cupertino, CA (US)

(72) Inventor: John Raff, Menlo Park, CA (US)

(*) Notice: Subject to any disclaimer, the term of this patent is extended or adjusted under 35 U.S.C. 154(b) by 0 days.

(21) Appl. No.: 13/908,970

(22) Filed: Jun. 3, 2013

(65) Prior Publication Data

US 2014/0111927 A1    Apr. 24, 2014

Related U.S. Application Data

(60) Provisional application No. 61/715,970, filed on Oct. 19, 2012.

(51) Int. Cl.
*G06F 1/16* (2006.01)

(52) U.S. Cl.
CPC ............... *G06F 1/16* (2013.01); *G06F 1/1637* (2013.01)

(58) Field of Classification Search
USPC ........................................ 361/679.56, 679.59
See application file for complete search history.

(56) References Cited

U.S. PATENT DOCUMENTS

| 8,199,477 | B2 | 6/2012 | Mathew et al. | |
| 8,437,131 | B2* | 5/2013 | Dai et al. | 361/679.55 |
| 8,594,755 | B1* | 11/2013 | Tages et al. | 455/575.8 |
| 8,737,045 | B2* | 5/2014 | Dai et al. | 361/679.01 |
| 2010/0315769 | A1* | 12/2010 | Mathew et al. | 361/679.29 |
| 2011/0005662 | A1 | 1/2011 | Sung | |
| 2011/0305875 | A1 | 12/2011 | Sanford et al. | |
| 2012/0194998 | A1 | 8/2012 | McClure et al. | |
| 2013/0128433 | A1 | 5/2013 | Dannoux et al. | |

FOREIGN PATENT DOCUMENTS

| WO | 2011/084184 A1 | 7/2011 |
| WO | 2012/030563 A1 | 3/2012 |
| WO | 2012/064567 A1 | 5/2012 |

OTHER PUBLICATIONS

International Search Report, Application No. PCT/US2013/061770, dated Jan. 20, 2014.
Written Opinion, Application No. PCT/US2013/061770, dated Jan. 20, 2014.

* cited by examiner

*Primary Examiner* — Anthony Q Edwards
(74) *Attorney, Agent, or Firm* — Womble Carlyle Sandridge & Rice, LLP

(57) ABSTRACT

An enclosure for a portable computing device can include a cover glass affixed to an enclosure without trim pieces disposed between the cover glass and the disclosure. In one embodiment, the enclosure can include an edge profile that can define a relatively large contact pad about the enclosure. The contact pad can distribute impact forces over a relatively large area and thereby protect the cover glass integrity.

20 Claims, 6 Drawing Sheets

TRIMLESS GLASS ENCLOSURE INTERFACE

CROSS-REFERENCE TO RELATED APPLICATIONS

This application claims the benefit under 35 U.S.C. 119(e) of U.S. Provisional Patent Application No. 61/715,970, filed Oct. 19, 2012 and entitled "TRIMLESS GLASS ENCLOSURE INTERFACE" by John RAFF which is incorporated herein by reference in its entirety for all purposes.

FIELD OF THE DESCRIBED EMBODIMENTS

The described embodiments relate generally to enclosures for portable computing devices and more particularly to glass interfaces with enclosures for portable computing devices.

BACKGROUND

Portable computing devices such as media players or tablet computers typically include a generous display configured to show a user graphical output and oftentimes the display is combined with a touch sensitive input device that allows the user to control the portable computing device.

As portable computing devices become more compact, the enclosure design and the display must also become smaller. However, simply size reducing older designs can provide a product that may not provide adequate display area or may not adequately protect a cover glass attached to the portable computing device. Furthermore, conventional device enclosures include trim gaskets, trim pieces, or other trim-protective features which may decrease the aesthetics of a final device.

Therefore, what is desired is a portable computing device with an enclosure design that can be reduced in size, that can increase aesthetic qualities, and that will adequately protect the cover glass.

SUMMARY OF THE DESCRIBED EMBODIMENTS

This paper describes various embodiments that relate to enclosures for a portable computing device. In one embodiment, a method for attaching a cover glass to an enclosure of a portable computing device absent a trim piece disposed between the cover glass and the enclosure is disclosed. The method includes affixing a display assembly to the enclosure, applying an adhesive to the enclosure, and attaching the cover glass to the adhesive.

In another embodiment, an enclosure for a portable computing device can include a body formed from a single and continuous piece of aluminum, the body including a bottom an four side walls, where at least one side wall includes a profile including a curve and an apex where the apex is arranged to be located on a 45 degree slope below an upper corner of the body, an opening configured to receive internal components, a support ledge configured to receive an adhesive and a cover glass configured to fit within the opening and bond to the adhesive on the support ledge.

In another embodiment, a personal computing device is disclosed. The personal computing device may be a tablet computer, telephone, media player, or other computing device. The device may include a body formed from a single and continuous piece of aluminum. The body may include a bottom and at least one side wall. The at least one side wall includes a profile including a curve and an apex arranged to be located on a slope below an upper corner of the body. The body may further include a cavity configured to receive internal components, a support ledge configured to receive an adhesive, and a cover glass configured to fit within the opening and bond to the adhesive on the support ledge.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Figure 1:
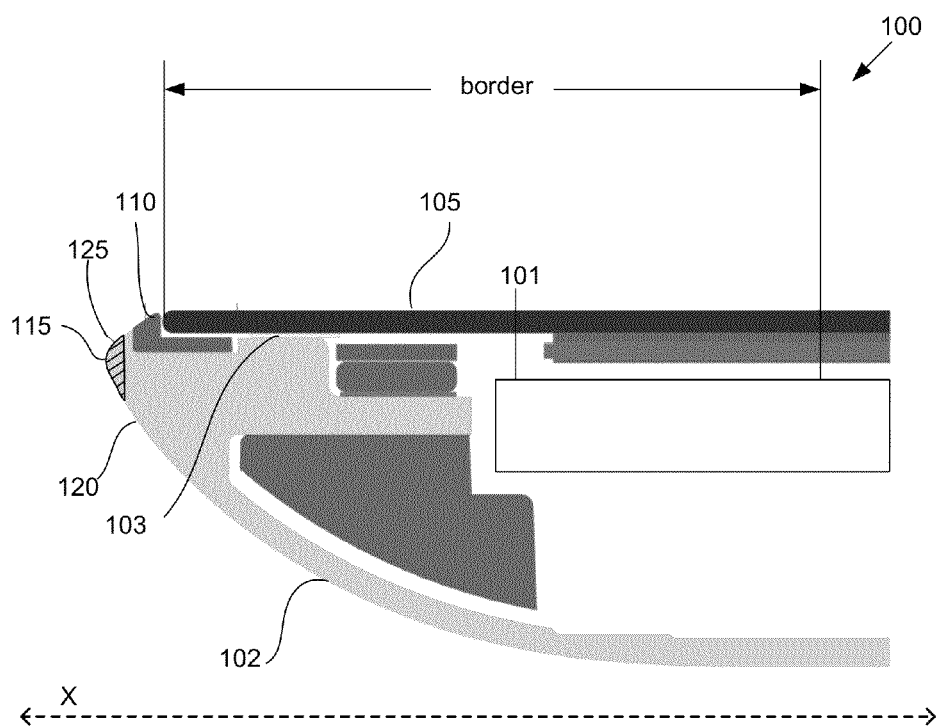
FIG. 1 (Prior Art) is a cross sectional view of a conventional portable computing device.

FIG. 1 is a cross sectional view of a conventional portable computing device 100. The portable computing device 100 can include an enclosure 102. The enclosure can form a cavity that can enclose various functional components for the portable computing device such as a battery, a processor, memory, wireless interfaces etc. The portable computing device 100 can include a display assembly 101 that can include a liquid crystal display, filters and a light source. The portable computing device 100 can include a cover glass 105 that can be attached to the enclosure 102 with an adhesive 103. Disposed between cover glass 105 and enclosure 102 is a trim piece 110. The trim piece 110 can absorb some shock that can be transmitted from enclosure 102 to cover glass 105 when portable computing device 100 is exposed to an impact along the X-axis as shown. Additionally trim piece 110 can be used to mask any tolerance build up problems that can be present in the design of portable computing device 100, particularly in the area of the interface between the cover glass 105 and the enclosure 102.

An impact along the X-axis can occur when portable computing device falls and lands on or near apex 115. The edge profile 120 near apex 115 can define a narrow contact pad 125 (shown with cross hatched lines). A consequence of the narrow contact pad 125 is that forces subjected to the region of the narrow contact pad 125 are concentrated and can deliver a relatively sharper shock or impact in the region near narrow contact pad 125, such as near cover glass 105. In some cases, a blow or impact to the narrow contact pad 125 can cause damage to cover glass 105, even with trim piece 110 available to absorb a portion of the impact forces.

Figure 2:
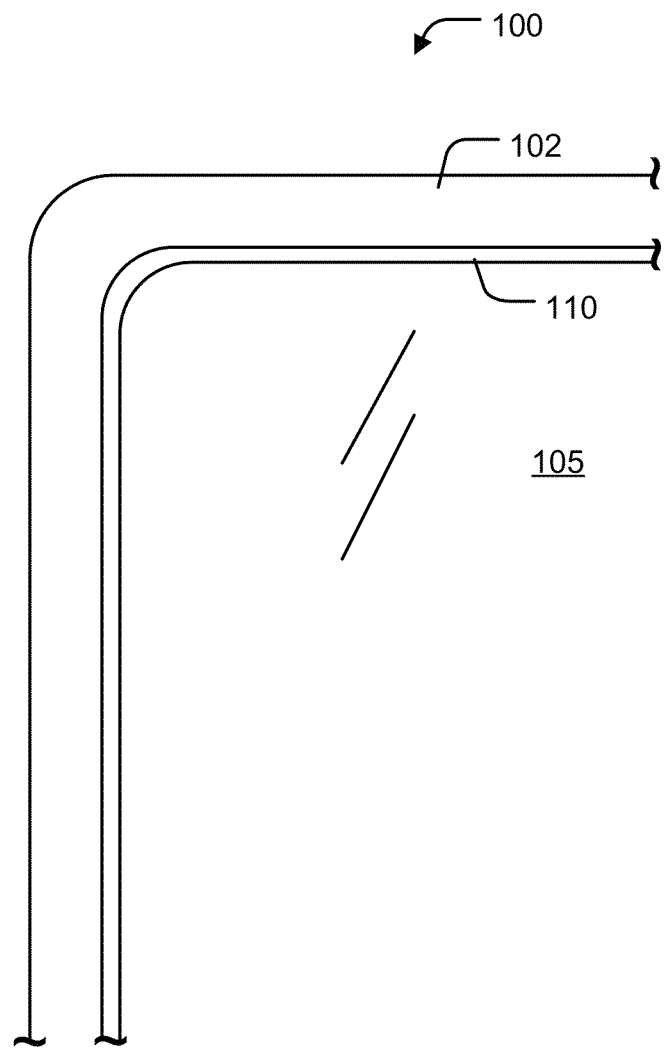
FIG. 2 (Prior Art) is a planar view of a portion of the computing device of FIG. 1.

FIG. 2 is a planar view of a portion of the device 100. As shown, the device 100, when viewed from above the cover glass 105, includes a clear view of the trim piece 110. The trim piece 110 extends about the cover glass 105, and therefore is seen while a user is manipulating or using device 100. As such, the trim piece 110 may detract from the overall aesthetic quality of device 100.

However, exemplary embodiments of the present invention provide methods and apparatuses which overcome these and other drawbacks, as described below.

Figure 3:
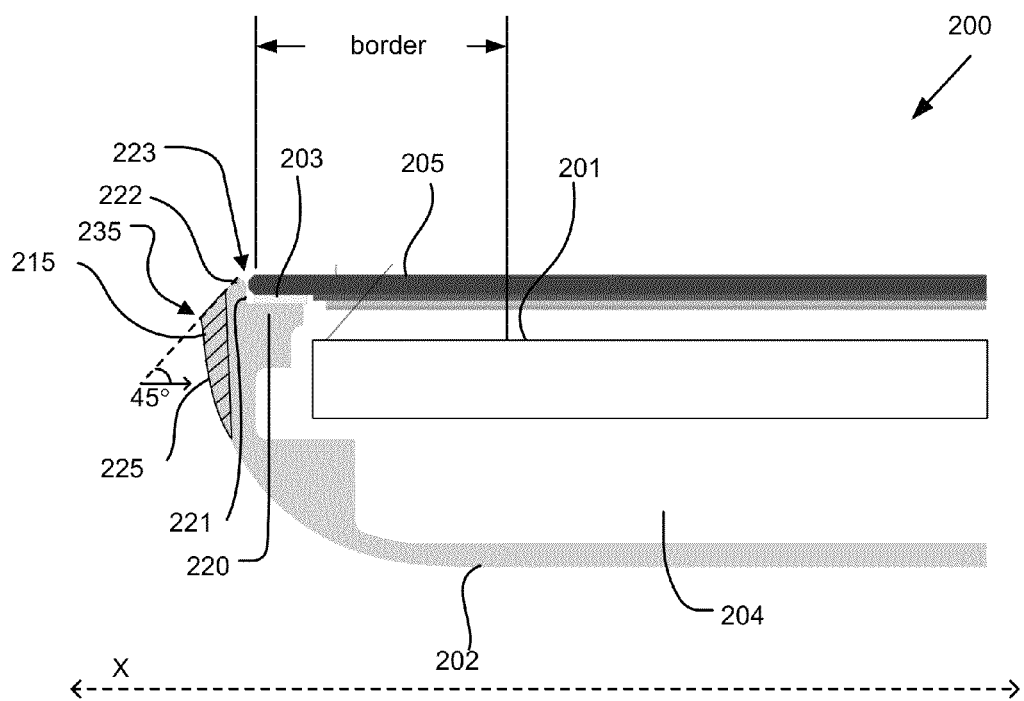
FIG. 3 is a cross sectional view of a portable computing device in accordance with an exemplary embodiment of the invention.

FIG. 3 is a cross sectional view of a portable computing device 200 in accordance with an exemplary embodiment of the invention. Portable computing device 200 can include an enclosure 202. The enclosure 202 can be formed from a resilient and sturdy material. In one embodiment, enclosure 202 can be formed from aluminum. Enclosure 202 can be shaped to form a cavity 204 to enclose and protect various components that can be included with the portable computing device 200 such as a processor, memory, wireless interfaces, battery, etc. Portable computing device can also include a display assembly 201 that can include a LCD display and a backlight. In one embodiment, the display assembly 201 can be configured to include a relatively smaller border area than conventional display assemblies. Smaller border areas can enable an active screen area to be affected to a lesser extent even when an overall size of the portable computing device 200 can be smaller than portable computing device 100.

Adhesive 203 can be disposed on a support 220 formed within enclosure 202. In one embodiment adhesive 203 can bond a cover glass 205 to enclosure 202. The cover glass 205 can be bonded directly to enclosure 202 without any extra layers between cover glass 205 and enclosure 202 (such as trim piece 110 shown above). In one embodiment machining operations for the enclosure 202, especially operations for forming support 220 and side wall 221 can be formed at relatively the same time thereby allowing relatively good control of tolerances associated with the opening configured to receive cover glass 205. Machining operations for cover glass 205 can also be well controlled enabling the cover glass 205 to fit relatively well with a highly controlled gap 223 between enclosure 202 and cover glass 205.

Enclosure 202 can include a gentle sweeping edge profile 225. The edge profile 225 can form a broad contact pad 215. The broad contact pad 215 can spread any impact forces received in this edge area over a relatively greater area than the narrow contact pad 125. This larger area can absorb and distribute impact forces through more of enclosure 202. The gentle sweeping edge profile 225 also provides a less prominent apex 235 in the edge area. The less prominent apex 235 can also help distribute impact forces received in the edge area. In one embodiment, apex 235 can be positioned on a 45 degree line emanating from top corner 222 of enclosure 202. In another embodiment, the apex 235 can be positioned on a line at a differing angle than that illustrated, according to any desired structural or aesthetic characteristics of a finished product.

According to one embodiment, device 200 weighs approximately 0.7 lbs. According to another embodiment, device 200 weighs less than about 0.7 lbs. According to yet another embodiment, the device 200 weighs less than about 1.4 lbs. Accordingly, the relatively low weight of device 200 further enhances the applicability of the edge profile 225, allowing for the clean lined top-down view without necessitating the additional trim piece 110 of device 100. However, in some embodiments, a trim piece somewhat similar to trim piece 110 may be included for additional protection of cover glass 205.

According to one embodiment, the gap 223 is approximately 0.05 mm. According to another embodiment, the gap 223 is less than about 0.05 mm. According to yet another embodiment, the gap 223 is slightly larger than about 0.05 mm. Accordingly, the small size of the gap 223 allows for a desirable and clean interface between the enclosure 202 and display panel glass 205 further enhancing aesthetics of the device 200.

Figure 4:
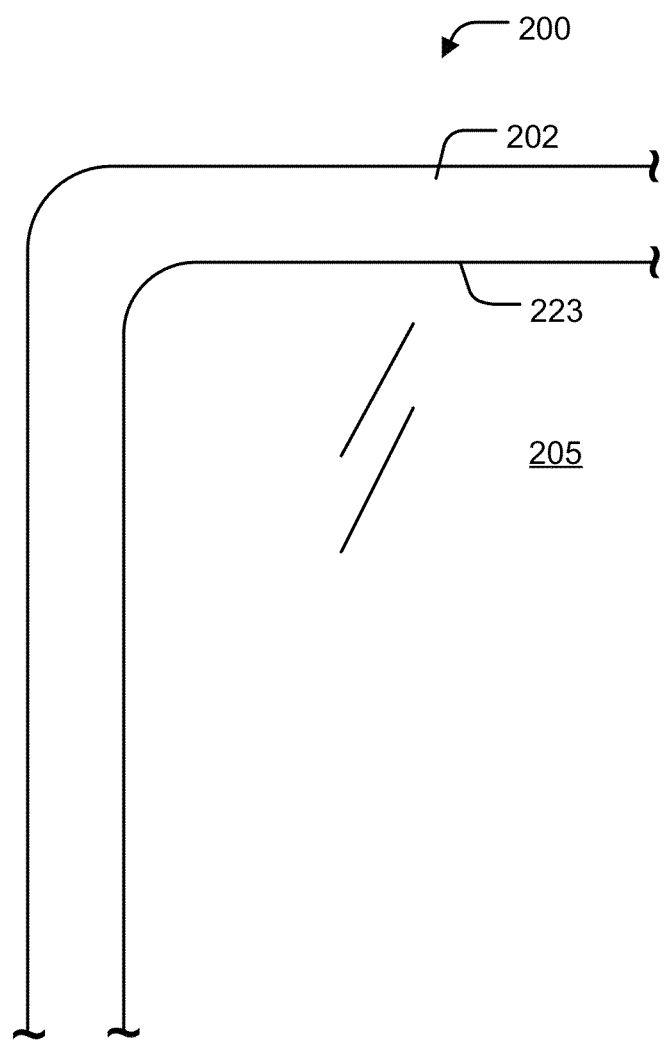
FIG. 4 is a planar view of a portion of the computing device of FIG. 3.

FIG. 4 is a planar view of a portion of the device 200. As shown, the device 200, when viewed from above the cover glass 205, includes a clean and desirable interface between cover glass 205 and enclosure 202, with only the relatively small gap 223 viewable. As such, the aesthetic quality of device 200 may be desirable.

Figure 5:
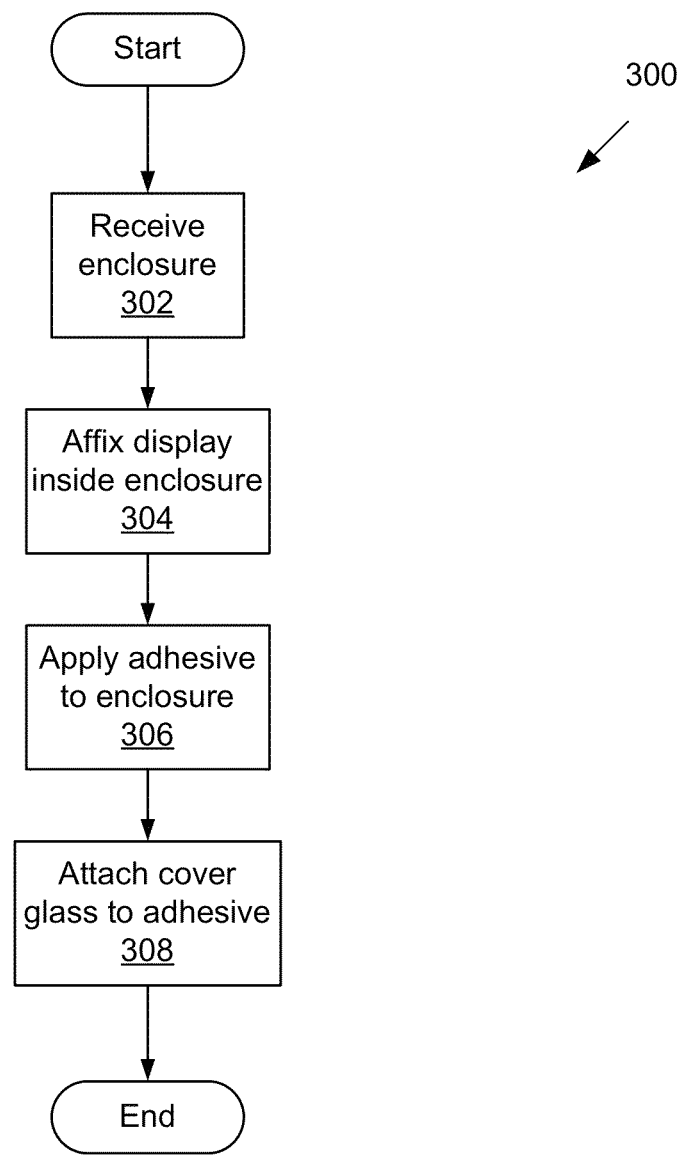
FIG. 5 is a flow chart of a method of forming a device in accordance with an exemplary embodiment of the invention.

FIG. 5 is a flow chart 300 of a method of forming a device similar to device 200, according to an exemplary embodiment of the invention. The method can begin in step 302 by receiving the enclosure 202. In step 304, a display assembly 201 can be mounted within the enclosure 202 and/or cavity 204. In step 306, adhesive 203 can be applied to the enclosure 202. In one embodiment, adhesive 203 can be applied to support 220 on enclosure 202. In another embodiment, adhesive 203 can be a pressure sensitive adhesive. In yet another embodiment, adhesive 203 can be a compliant foam with a pressure sensitive adhesive applied on two sides of the compliant foam. In step 308, the cover glass 205 can be attached to the adhesive.

As described above, the enclosure 202 may be received, a display assembly mounted, and a cover glass attached. However, the same may be varied in many ways. For example, pressure sensitive adhesive may be applied in any step preceding application of the cover glass 205. Furthermore, machining, polishing, and other steps may also be applicable.

Figure 6:
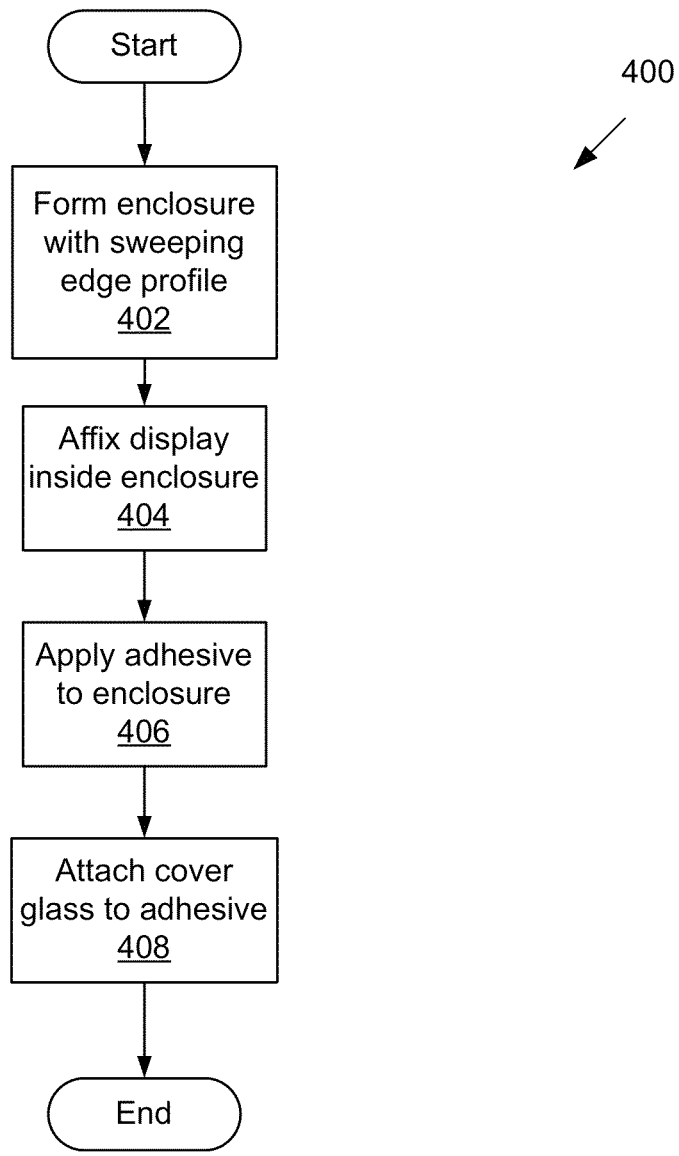
FIG. 6 is a flow chart of a method of forming a device in accordance with an exemplary embodiment of the invention.

For example, FIG. 6 is a flow chart of a method 400 of forming a device similar to device 200, according to an exemplary embodiment of the invention. The method 400 can begin in step 402 by forming the enclosure 202 with the sweeping edge profile 225 and associated sidewall 221 adjacent to support 220. The forming may include forming the enclosure 202 from a single piece of aluminum, for example, using a machining device, cutting device, or any other suitable device to form the features described herein.

In step 404, a display assembly 201 can be mounted within the enclosure 202 and/or cavity 204. In step 406, adhesive 203 can be applied to the enclosure 202. In step 408, the cover glass 205 can be attached to the adhesive.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for attaching a cover glass to an enclosure of a portable computing device, the method comprising:
    forming a bottom portion in the enclosure;
    forming a sidewall extending from the bottom portion;
    forming a profile in the sidewall, the profile including a slope having an apex defined by a junction between a sloped surface extending from a top corner of the enclosure and a curved surface extending from the bottom portion;
    affixing a display assembly to the enclosure;
    applying an adhesive to a support ledge in the enclosure; and
    adhesively attaching the cover glass to the support ledge.

2. The method of claim 1, wherein affixing the display assembly to the enclosure comprises forming a cavity in the enclosure for housing the display assembly.

3. The method of claim 1, wherein the apex extends away from the top corner of the enclosure.

4. The method of claim 1, wherein the apex exclusively defines an outermost edge of the enclosure.

5. The method of claim 1, wherein adhesively attaching the cover glass to the support ledge further comprises forming a gap between the top corner of the enclosure and the cover glass.

6. The method of claim 5, wherein forming the gap between the top corner of the enclosure and the cover glass comprises controlling the gap to be less than approximately 0.05 mm.

7. The method of claim 1, wherein applying the adhesive to the support ledge further comprises:
    applying a pressure sensitive adhesive on two sides of a compliant foam; and placing the compliant foam on the support ledge.

8. The method of claim 1, wherein at least one of forming the bottom in the enclosure, forming the sidewall extending from the bottom portion, and forming the profile in the sidewall comprises any one of: machining a piece of aluminum and cutting a piece of aluminum.

9. An enclosure for a portable computing device, the enclosure comprising:
    a body formed from a single piece of material, the body comprising:
        a bottom having a first ledge configured to support a display assembly; and
        a side wall having an apex defined by a junction between both a sloped surface extending from a top corner of the enclosure and a curved surface extending from the bottom;
        a second ledge adjacent to the side wall; and
        a cover glass adhesively bonded to the second ledge, wherein a gap exists between the cover glass and the top corner of the enclosure.

10. The enclosure of claim 9, wherein the apex extends away from the top corner of the enclosure.

11. The enclosure of claim 9, wherein the gap between the top corner of the enclosure and the cover glass is less than approximately 0.05 mm.

12. The enclosure of claim 9, wherein the body includes a broad contact pad configured to spread impact forces over an area relatively greater than an area of the broad contact pad.

13. The enclosure of claim 9, wherein the apex exclusively defines an outermost edge of the body.

14. A personal computing device, comprising:
    a body formed from a single and continuous piece material, the body comprising:
        a bottom having a first ledge configured to support and abut a display assembly;
        a side wall, wherein the side wall includes an apex defined by a junction between both a sloped surface extending from a top corner of the body and a curved surface extending from the bottom;
        a second ledge adjacent to the side wall; and
        a cover glass adhesively bonded to the body at the second ledge.

15. The personal computing device of claim 14, wherein the apex extends away from the top corner.

16. The personal computing device of claim 14, wherein the body includes a cavity configured to support:
    a processor;
    a memory in communication with the processor;
    at least one wireless interface in communication with the processor; and
    at least one battery configured to power the processor, the memory, and the at least one wireless interface.

17. The personal computing device of claim 14, wherein the body comprises at least four sidewalls, and wherein the at least four side walls each include a profile having an apex located on a slope below the top corner of the body relative to each sidewall.

18. The personal computing device of claim 14, wherein the side wall is adjacent the second ledge and the top corner of the body forms a narrow gap with the cover glass.

19. The personal computing device of claim 14, wherein the profile forms a contact pad adjacent to the top corner of the body, and wherein the contact pad is configured to spread impact forces received on the contact pad over an area relatively greater than an area of the contact pad.

20. The personal computing device of claim 14, wherein the apex exclusively defines an outermost edge of the body.

* * * * *